(12) United States Patent
Meissner et al.

(10) Patent No.: US 11,385,106 B2
(45) Date of Patent: Jul. 12, 2022

(54) ASSEMBLY FOR DETECTING TEMPERATURE AND CONTACT ASSEMBLY HAVING SUCH AN ASSEMBLY

(71) Applicant: TE Connectivity Germany GmbH, Bensheim (DE)

(72) Inventors: Tobias Meissner, Mannheim (DE); Frank Wittrock, Schriesheim (DE)

(73) Assignee: TE Connectivity Germany GmbH, Bensheim (DE)

( * ) Notice: Subject to any disclaimer, the term of this patent is extended or adjusted under 35 U.S.C. 154(b) by 507 days.

(21) Appl. No.: 16/359,114

(22) Filed: Mar. 20, 2019

(65) Prior Publication Data
US 2019/0293493 A1    Sep. 26, 2019

(30) Foreign Application Priority Data

Mar. 20, 2018   (DE) .......................... 102018204271

(51) Int. Cl.
| | | |
|---|---|---|
| *G01K 1/16* | (2006.01) | |
| *G01K 1/14* | (2021.01) | |
| *G01K 7/42* | (2006.01) | |
| *H05K 1/18* | (2006.01) | |
| *H01R 13/627* | (2006.01) | |
| *B60L 53/16* | (2019.01) | |
| *H01R 13/66* | (2006.01) | |

(52) U.S. Cl.
CPC ............... *G01K 1/16* (2013.01); *B60L 53/16* (2019.02); *G01K 1/14* (2013.01); *G01K 7/42* (2013.01); *H01R 13/6271* (2013.01); *H01R 13/66* (2013.01); *H01R 13/665* (2013.01); *H01R 13/6658* (2013.01); *H01R 13/6683* (2013.01); *H05K 1/181* (2013.01); *H05K 2201/10151* (2013.01)

(58) Field of Classification Search
CPC ............ H01R 13/6658; H01R 13/6271; H01R 13/6683; H01R 13/66; H01R 13/665; H05K 1/181; H05K 1/10151; G01K 1/16; G01K 1/14; G01K 7/42; B60L 53/16
USPC ................................ 439/620.01–620.25, 936
See application file for complete search history.

(56) References Cited

U.S. PATENT DOCUMENTS

| | | | | |
|---|---|---|---|---|
| 4,668,375 A | * | 5/1987 | Kato | .................. G01N 27/4071 |
| | | | | 200/268 |
| 5,492,482 A | * | 2/1996 | Lockman | .................. G01K 7/12 |
| | | | | 439/329 |

(Continued)

FOREIGN PATENT DOCUMENTS

| | | |
|---|---|---|
| DE | 102005039764 A1 | 3/2007 |
| DE | 102014111185 A1 | 2/2016 |

(Continued)

OTHER PUBLICATIONS

German Office Action, dated Oct. 5, 2018, 7 pages.
Abstract of EP2431718, dated Mar. 21, 2012, 1 page.

*Primary Examiner* — Gary F Paumen
(74) *Attorney, Agent, or Firm* — Barley Snyder (57) ABSTRACT

An assembly for detecting a temperature of an electrically conductive element comprises a temperature probe and a heat conductor separate from the temperature probe and made of an electrically insulating and heat-conductive material. The heat conductor surrounds the temperature probe at least in sections and has a bearing surface bearing against the electrically conductive element.

22 Claims, 6 Drawing Sheets

(56) References Cited

U.S. PATENT DOCUMENTS

| | | | |
|---|---|---|---|
| 7,775,708 B2 | 8/2010 | Barkic et al. | |
| 8,591,243 B2* | 11/2013 | Brune | H01R 13/5216 |
| | | | 439/276 |
| 9,562,811 B2 | 2/2017 | Husheer | |
| 10,153,598 B2* | 12/2018 | Watanabe | H01R 13/582 |
| 2016/0056588 A1* | 2/2016 | Motoichi | H01R 13/7137 |
| | | | 439/620.22 |
| 2016/0104978 A1* | 4/2016 | Chaumeny | H01R 13/6683 |
| | | | 439/620.22 |
| 2017/0237205 A1* | 8/2017 | Fuehrer | B60L 3/0023 |
| | | | 439/620.22 |
| 2018/0045576 A1 | 2/2018 | Wang et al. | |
| 2019/0260146 A1* | 8/2019 | Feldner | H01R 12/714 |

FOREIGN PATENT DOCUMENTS

| | | |
|---|---|---|
| DE | 202017104847 U1 | 10/2017 |
| DE | 112016004047 T5 | 6/2018 |
| EP | 2431718 A2 | 3/2012 |
| WO | 2018011687 A1 | 1/2018 |

* cited by examiner

ASSEMBLY FOR DETECTING TEMPERATURE AND CONTACT ASSEMBLY HAVING SUCH AN ASSEMBLY

CROSS-REFERENCE TO RELATED APPLICATION

This application claims the benefit of the filing date under 35 U.S.C. § 119(a)-(d) of German Patent Application No. 102018204271.3, filed on Mar. 20, 2018.

FIELD OF THE INVENTION

The present invention relates to an electrically conductive element and, more particularly, to an assembly for detecting a temperature of the electrically conductive element.

BACKGROUND

An assembly for detecting a temperature, and a contact assembly having such an assembly, are used, for example, to monitor electroconductive elements. If, for example, a temperature threshold is reached, this can indicate if a maximum permissible current is flowing through the electrically conductive element, or even if there is an incomplete or faulty contact. A faulty contact can, for example, lead to a reduced effective electroconductive cross-section of the electrically conductive element, such that in the case of a fixed current, said element can heat up beyond a temperature threshold set within the specification. In particular in the sector of electromobility, a faulty contact of this type is crucial and must be avoided. Voltages present in this sector in the range of 1 kV and the current flowing into the DC circuits in the range of approximately 200 A can, within less than a minute, lead to excessive heating of a faulty contact beyond predetermined thresholds. In the case of such an overheating, the risks not only include the thermal destruction of the contact assembly and the surrounding elements, but also leakage of poisonous vapors/gases and the onset of fires. Reliably identifying excessively high currents being transmitted, as well as faulty electrical contacting by identifying a temperature of the electrically conductive element, can reduce or even eliminate the abovementioned risks.

Known solutions, however, have discrepancies in the determined temperature value. The determined temperature threshold can only be determined with a delay, i.e. a temperature value determined at a particular time does not represent the currently prevailing temperature of the electrically conductive element.

Figure 1:
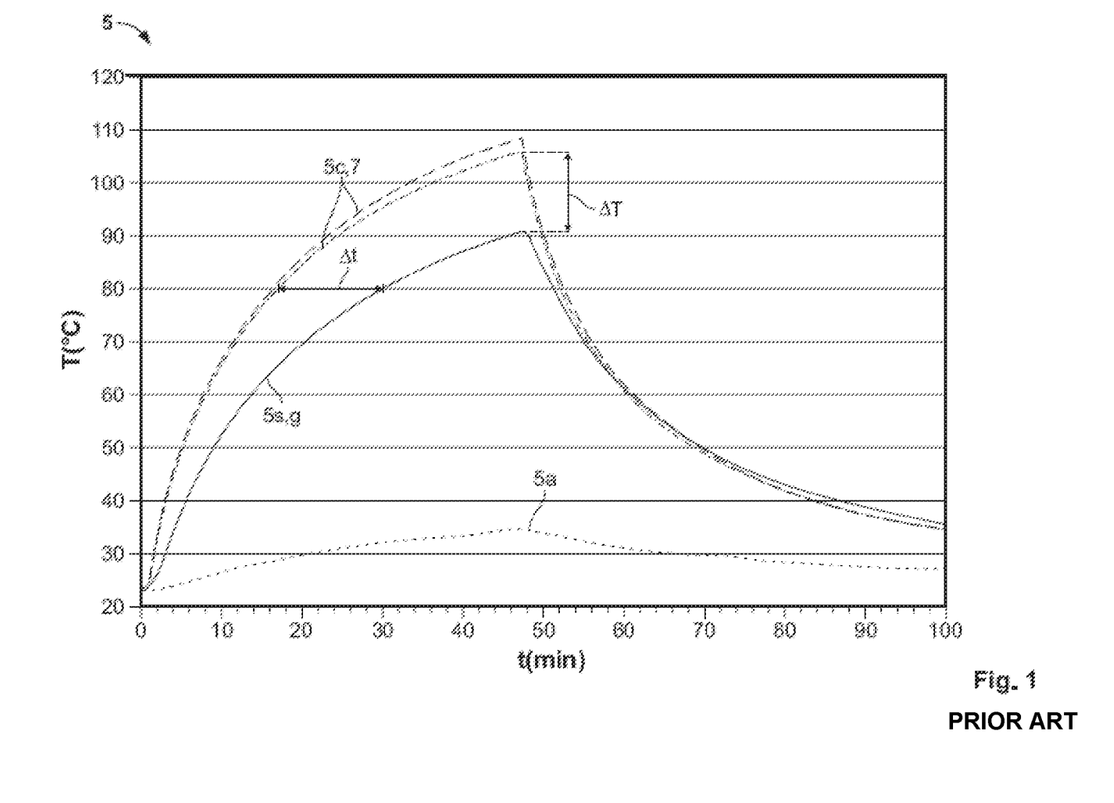
FIG. 1 is a graph of a measured temperature profile of an electrically conductive element and a temperature probe of an assembly according to the prior art.
Figure 2:
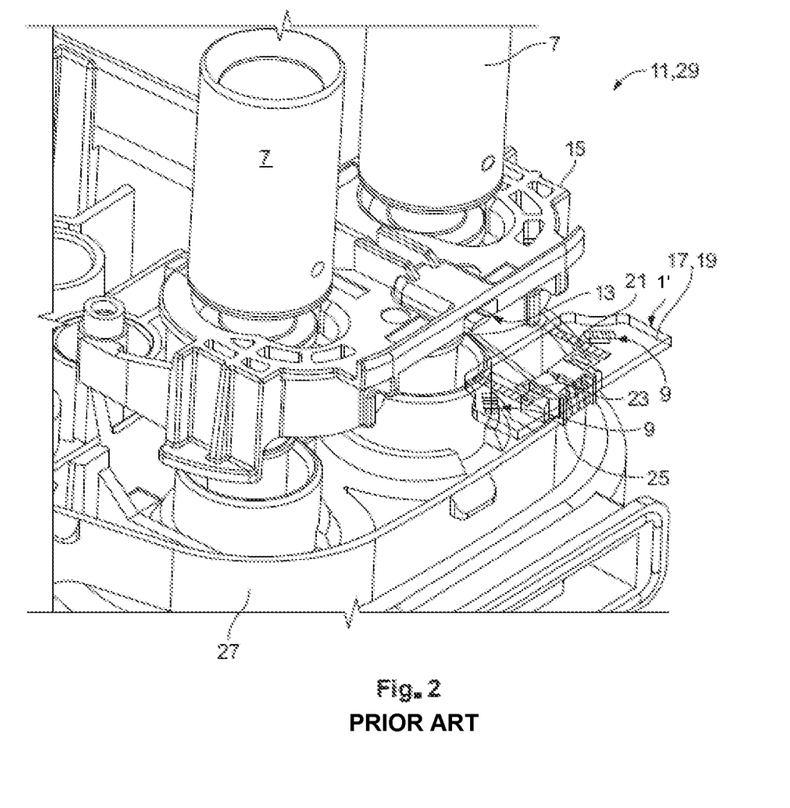
FIG. 2 is a perspective view of an assembly according to the prior art.

An assembly 1' from the prior art and exemplary measured temperature profiles 5 of the assembly 1' are shown in FIGS. 1 and 2. In FIG. 1, the temperature T is plotted against the time t, wherein the range of temperature T from 20° C. to 120° C. and the range of time t from 0-100 minutes is shown. The dotted line 5a represents the temperature profile of the ambient temperature. The broken lines 5c represent two temperature profiles 5, which describe the development of the temperature T of two electrically conductive elements 7, shown in FIG. 2. The two temperature profiles 5c are only slightly different from one another, which can be attributed to deviations related to construction and/or possible empirical deviations during measuring. The continuous line 5s in FIG. 1 is the temperature profile 5 of a temperature probe 9.

The assembly 1' for detecting the temperature T of at least one electrically conductive element 7 from the prior art is shown in FIG. 2. The assembly 1' is drawn to be partially transparent and is provided to be used in a contact assembly 11. The assembly 1' is received in a sensor receptacle 13 of a secondary latching element 15.

As shown in FIG. 2, the assembly 1' comprises a circuit board 17, which can be configured as a printed circuit board 19 (PCB) for example, and two temperature probes 9 which are mechanically and electrically connected to the PCB 19. The assembly 1' includes an evaluation unit 21, a storage unit 23, and a contacting region 25 for contacting the PCB 19 and elements which are attached thereto, such as the temperature probes 9. Via the contacting region 25, the PCB 19 can output a value representing the temperature T measured by the temperature probes 9.

The PCB 19 is received in the secondary latching element 15, as shown in FIG. 2, and the secondary latching element 15 is, in turn, arranged and/or secured in a contact housing 27 of the contact assembly 11. The contact assembly 11 can be a socket 29 or a plug 31 and can be used in the field of electrically operated vehicles, for example, in the shape of charging sockets and charging plugs. In such an application, such an assembly allows the temperature of the electrically conductive element or elements to be measured or monitored.

The disadvantages of the solutions of the prior art are clear from the graph of FIG. 1. On the one hand, a temperature difference ΔT between the temperature profiles 5c and 5s can be observed, which is approximately 15 K in the measurement shown. Furthermore, the temperature profile 5s is temporally delayed relative to the temperature profile 5c, which is represented, for example, by a delay time Δt in FIG. 1. For example, the temperature T of 80° C. is reached by the electrically conductive element 7 after approximately sixteen minutes, whereas the temperature probe 9 only reaches this temperature after approximately thirty minutes. Determining the temperature of the electrically conductive element 7 in a timely and precise manner is thus not possible with the solutions from the prior art.

In the course of this disclosure, the term "timely" should not be understood to mean instantaneously. Temperature measurements are always associated with a certain temporal delay, since the heat of the object which is to be measured has to be transmitted to a temperature probe. This transmission and in particular the time frame within which this occurs depends on different parameters, for example the temperature difference between the electrically conductive element and the temperature probe, the heat conductivity between the two elements, the specific heat capacity of the temperature probe, and on the like. The measuring shown in FIG. 1 indicates that sometimes delay times Δt in the range of 10-20 minutes can occur. If such a delay time Δt is taken as a basis, a temperature measuring with a delay time Δt in the range of one or two minutes can indeed be described as timely. Furthermore, a precisely determined temperature should not be understood as a highly accurate determination, exact to 1/10 degrees Celsius, of the temperature, but instead as a measuring with an accuracy of ±5° C.

SUMMARY

An assembly for detecting a temperature of an electrically conductive element comprises a temperature probe and a heat conductor separate from the temperature probe and made of an electrically insulating and heat-conductive material. The heat conductor surrounds the temperature probe at least in sections and has a bearing surface bearing against the electrically conductive element.

BRIEF DESCRIPTION OF THE DRAWINGS

The invention will now be described by way of example with reference to the accompanying Figures, of which.

DETAILED DESCRIPTION OF THE EMBODIMENT(S)

Embodiments of the present invention will be described hereinafter in detail with reference to the attached drawings, wherein like reference numerals refer to like elements. The present invention may, however, be embodied in many different forms and should not be construed as being limited to the embodiments set forth herein; rather, these embodiments are provided so that the disclosure will convey the concept of the invention to those skilled in the art.

Hereinafter, the present invention is explained in greater detail using the attached drawings. The attached drawings show specific configurations of the assembly according to the invention as well as the contact assembly according to the invention. The technical features of the configurations shown hereinafter can be combined with one another as desired and can also be omitted in other configurations, as long as the technical effect achieved by the technical feature being omitted is not important. The specific configurations described do not restrict the intended scope of protection, but instead simply represent some of the plurality of possible configurations of the invention. Furthermore, the assembly according to the invention or the contact assembly according to the invention are not limited to the specified number of technical features and can thus have, for example, a plurality of temperature probes, for example 3, 4, 5 or more temperature probes. Identical technical features and technical features with the same technical function are hereinafter provided with the same reference numbers in each case. A repetitive description is dispensed with and explicit reference is only made to differences between the configurations shown in the different figures.

Figure 3:
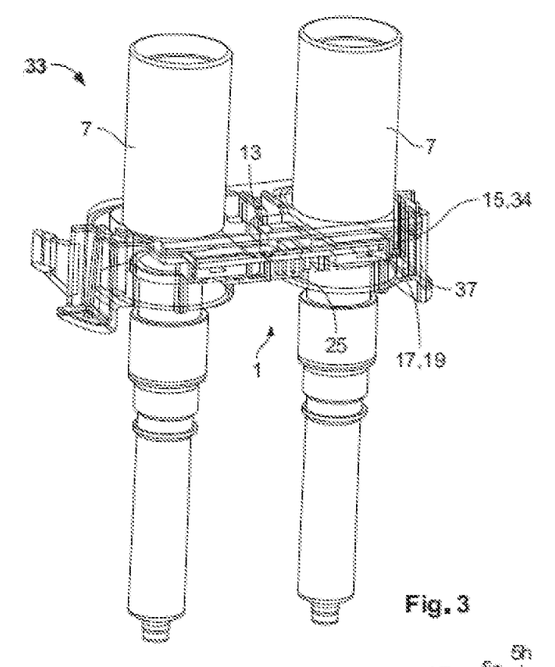
FIG. 3 is a perspective view of a contact assembly according to an embodiment of the invention.
Figure 4:
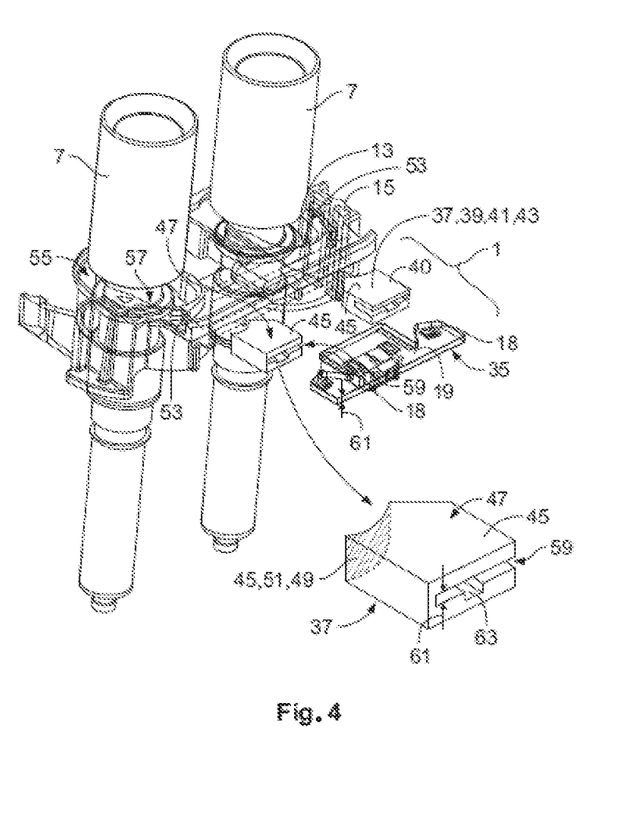
FIG. 4 is an exploded perspective view of the contact assembly of FIG. 3.
Figure 5:
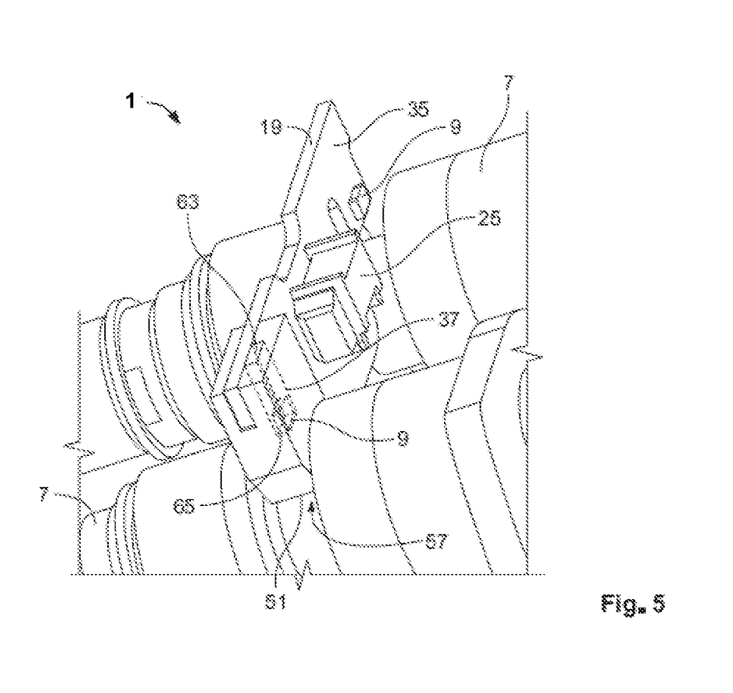
FIG. 5 is a detail perspective view of the contact assembly of FIG. 3.

An assembly 1 according to an embodiment is shown in FIGS. 3-5. The assembly 1 is shown with a pair of electrically conductive elements 7 and a secondary latching element 15 in a mounted state 33 in FIG. 3 and exploded in FIG. 4. FIG. 5 shows the assembly 1 connected with just the electrically conductive elements 7. The secondary latching element 15 and/or the PCB 19 are drawn to be partially transparent, so that the temperature probes 9 which are arranged on an underside 35 can be seen. In an embodiment, the two electrically conductive elements 7 can be contacts of a charging apparatus for electric vehicles.

In an embodiment, the PCB 19 can have two temperature probes 9, so that two electrically conductive elements 7 can be examined and monitored, simultaneously and independently of one another, for possible overheating. In an embodiment, the temperature probe 9 is disposed on a tongue of the PCB 19.

The assembly 1 includes alongside the PCB 19, as shown in FIGS. 3-5, a pair of heat conductors 37 formed of an electrically insulating and heat-conductive material 39. In an embodiment, the material 39 is silicone 41, and in a further embodiment, is highly filled silicone 43. These materials 39, 41 have a breakdown voltage 40 of more than 500 V, and in an embodiment, up to more than 1000 V. The materials 39, 41 are mixed with microparticles 47. The microparticles 47 are materials with high heat conductivity.

The highly filled silicones 43, in an embodiment, can include granulates. The granulates/nanoparticles can, in particular, consist of silicon or of ceramic. Although silicon inherently has specific electrical properties (electrical conductivity), said electrical properties do not come into play since the silicon is embedded in the silicone. The granulates/nanoparticles can further consist of one or more of the following substances or compounds: aluminum, aluminum oxide, aluminum nitride, silicon carbide and silicon nitride. These substances/compounds can have a heat conductivity which is greater than that of pure silicone. Furthermore, they can also be electrically insulating (e.g. aluminum oxide), wherein, as already mentioned, an electrical heat conductivity (e.g. in the case of aluminum) through the electrically insulating effect of the silicone does not rule out the use of such conductive fillers.

A heat-conductive material 39 is understood to mean, in particular, such materials that have a heat conductivity of at least 0.2 W/(m K). Metals which, per se, can have a higher heat conductivity of up to several hundred W/(m K) are in fact better heat conductors (better in the sense of a higher heat conductivity), but they cannot be used for transmitting the temperature between the electrically conductive element 7 and the temperature probe 9, since they do not guarantee electrical insulation.

The heat conductors 37, as shown in FIG. 4, are elastically and reversibly deformable, and therefore have an elasticity 45. The heat conductors 37 include a bearing surface 49 indicated with a shading, the bearing surface 49 shown having a curvature 51. The bearing surface 49 is configured to be concave in the shown embodiment. In an embodiment, the heat conductor 37 is U-shaped, with a base formed by bearing surface 49 and lateral elements encompassing the temperature probe 9 or PCB 19.

In the mounted state 33, the bearing surface 49 of the heat conductor 37 is in a recess 53 shown in FIG. 4. The recess 53 connects the sensor receptacle 13 to a contact receptacle 55 of the secondary latching element 15, into which the electrically conductive elements 7 shown can be inserted. In the mounted state 33, into which the assembly 1 is movable with the secondary latching element 15, the bearing surface 49 of the heat conductor 37 is thus assembled abutting against the contact receptacle 55 or overlapping with the contact receptacle 55, so that the bearing surface 49 rests against a measuring point 57 of the electrically conductive element 7 and, by virtue of its elasticity 45 (at least the bearing surface 49 has this elasticity 45), rests tightly against the measuring point 57 and minimizes the occurrence of heat-insulative air gaps. The deformability of the bearing surface 49 also maintains contact in vibration environments. An almost form-fitting thermal connection between the electrically conductive element 7, the temperature of which is to be measured, and the temperature probe 9 is reached due to the heat conductor 37. The heat conductor 37 conducts the heat from the electrically conductive element 7 to the temperature probe 9.

The resting of the heat conductor 37 by its bearing surface 49 against the measuring point 57 is also shown in FIG. 5. In the mounted state 33 shown in FIG. 3, the secondary latching element 15 is in a position 34 in which the heat conductor 37 abuts against the contact receptacle 55 or overlaps with the contact receptacle 55. In an embodiment, the electrically conductive element 7 can be cylindrical or rod-shaped, it being possible for the outer radius at a temperature measuring point 57 of the electrically conductive element 7 to correspond to the radius of the concave bearing surface 49.

The electrically conductive elements 7 are received in the contact receptacle 55, it is thus guaranteed that a temperature measurement of the electrically conductive elements 7 is possible in at least one position of the secondary latching element 15. The at least one position corresponds to a latched position, the reaching of which can be an essential requirement in order to start the current connection through the electrically conductive elements 7.

The heat conductor 37 further has a slot 59, as shown in FIG. 4, adapted to receive the at least one temperature probe 9. The slot 59 can have a width 61, which corresponds substantially to the width 61 of the PCB 19, as shown in FIG. 5. A groove 63 extends into the body of the heat conductor 37, from the slot 59 in a direction parallel to the bearing surface 49. The temperature probe 9, which is attached to the PCB 19, can be received in this groove 63; in an embodiment, a tongue of the PCB 19 having the temperature probe 9 is received in the slot 59. The course of the groove 63 and the temperature probe 9 received on its end 65 are shown in FIG. 5.

When the PCB 19 is received in the heat conductor 37, the heat conductor 37 surrounds the temperature probe 9 and, in the configuration shown, also parts of the PCB 19 from at least three sides, so that creepage distances are significantly increased and the electrically conductive elements 7 are electrically insulated from elements of the PCB 19. At least one section 18 of the circuit board 17 or the PCB 19 shown in FIG. 4 can be plugged into the heat conductor 37. Two sections 18 which are plugged into the corresponding heat conductor 37 are shown in FIG. 3.

In another embodiment of the assembly 1, the heat conductor 37 does not, as shown in FIG. 5, terminate with the PCB 19, but instead can completely enclose the PCB 19. Only the contacting region 25 can be accessible in such a configuration. This complete enclosure has the advantage that the PCB 19, along with its electrical elements such as the at least one temperature probe 9, is protected against external environmental influences, such as corrosive gases or liquids. A heat conductor 37 of such a configuration is shown in FIG. 6C.

In an embodiment in which the PCB 19 has surface mounted devices (SMD), the heat conductor 37 is not in mechanical contact with the SMD. In such a configuration, the distance between the heat conductor 37 and the SMD should be selected to be as small as possible, so that an occurring air gap is as small as possible (for example a few 100 μm).

In an embodiment, the sensor receptacle 13 of the contact assembly 1, can be potted with the material of the heat conductor 37; an intermediate space between the assembly 1 and the boundaries of the sensor receptacle 13 is completely potted or filled with the material of the heat conductor 37. Such a potting, as mentioned previously, results in an inseparable connection and, in this case, protects the entire assembly 1 from harmful environmental conditions and vibrations.

Figure 7:
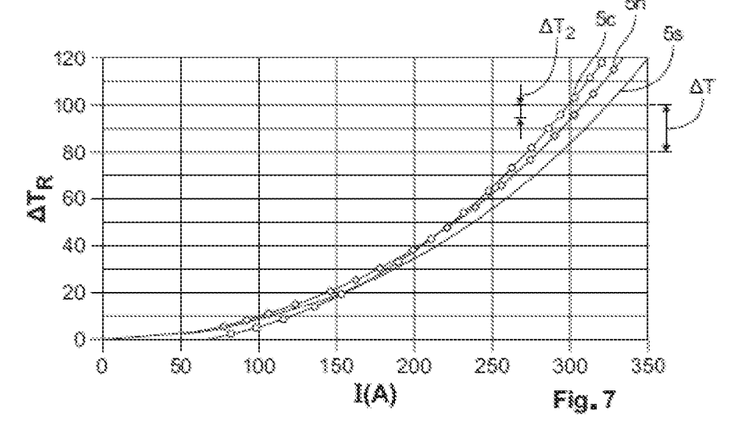
FIG. 7 is a graph of simulated temperature differences in the contact assembly according to the invention.

FIG. 7 shows a simulated (FEM) temperature increase ΔTR depending on a current I applied to the electrically conductive elements 7 with the assembly 1 according to the invention. The simulated values of the temperature increase ΔTR are each determined in a stationary state, i.e. irrespective of time. The simulation was proceeded on the assumption of electrically conductive elements 7, which on both sides have a cross-section of 70 mm$^2$ and an overall resistance of 90 microhms. A room temperature of 30° C. was assumed.

As shown in FIG. 7, a clear temperature difference ΔT between the temperature profile 5c (dotted) of the electrically conductive elements 7 and the temperature profile 5s of the temperature probe 9 can be recognized. In the case of a current of approximately 300 A, the temperature difference ΔT can be reduced from 18 K to approximately 6 K by using the heat conductor 37 according to the invention. The temperature profile 5h obtained with the heat conductor 37 is drawn as lines with diamonds. This temperature profile 5h can be consulted to detect the temperature profile 5c with a significantly lower error than with the temperature profile 5s. The second temperature difference ΔT2 can be further reduced by way of further optimization, for example of the material of the heat conductor 37.

Figure 6A:
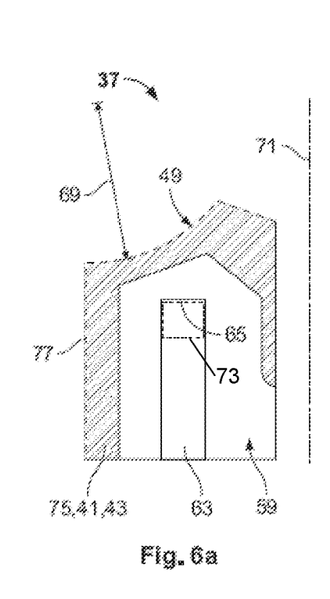
FIG. 6A is a sectional top view of a heat conductor of the contact assembly according to an embodiment.
Figure 6B:
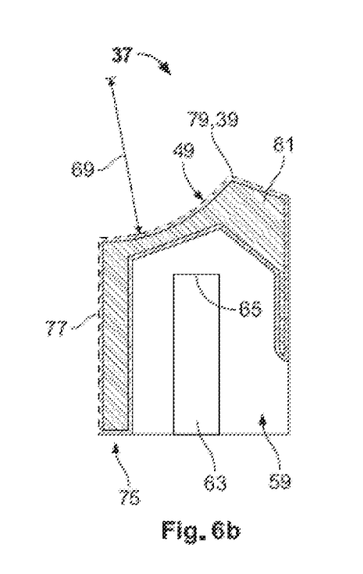
FIG. 6B is a sectional top view of a heat conductor according to another embodiment.
Figure 6C:
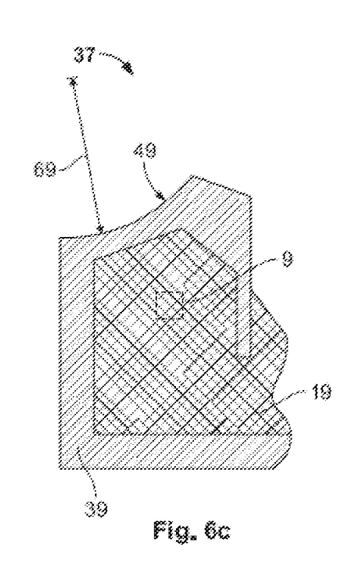
FIG. 6C is a sectional top view of a heat conductor according to another embodiment.

Different embodiments of the heat conductor 37 are shown in FIGS. 6A-6C. All three embodiments are centrally sectioned in the slot 59 in the shown orientation. Furthermore, all configurations shown have the bearing surface 49, which is shaped to be concave with a radius 69. This radius 69 corresponds to the radius 69 of the measuring point 57 of the corresponding electrically conductive element 7. In connection with FIG. 4, it is readily apparent that a second heat conductor 37 can be provided which is mirrored relative to an axis of symmetry 71. The axis of symmetry 71 is drawn in FIG. 6A merely by way of example.

The configurations of FIG. 6A and FIG. 6B each have the groove 63 in the slot 59, the groove 63 extends to the end 65 in the direction of the bearing surface 49. A temperature probe 9, which projects into the drawing plane from the PCB 19, can be received along this groove 63 up to a final position 73. The final position 73 is reached, for example, in the mounted state 33. The shape of the slot 59 can have other shapes in other embodiments, for example, it can be rounded, rectangular or triangular. The shape of the slot 59 is adapted to the shape of the PCB 19, i.e. shaped to be complementary thereto.

A body 75 of the heat conductor 37 of FIG. 6A consists completely of silicone 41 and in particular filled silicone 43. The body 75 can also comprise other materials in other embodiments, provided that they are electrically insulating and heat-conductive. A partial contour 77 is configured to be complementary to the sensor receptacle 13 of the secondary latching element 15. Sections of the partial contour 77 can be complementary to the measuring point 57.

The heat conductor 37 of FIG. 6B has a body 75 including an outer shell 79 and a heat-conductive medium 81 which is received in the outer shell 79. The outer shell 79 is an electrically insulating and heat-conductive material 39, and the heat-conductive medium 81 is, in an embodiment but not necessarily, electrically insulating. As long as the outer shell 79 has a sufficiently high breakdown voltage, and thus reliably electrically separates the electric circuits of the electrically conductive element 7 and of the PCB 19 from one another, an electrically conductive medium can also be used for the heat-conductive medium 81.

In the heat conductor 37 shown in FIG. 6C, the electrically insulating and heat-conductive material 39 completely surrounds the PCB 19, at least in the region of the indicated temperature probe 9. The material 39 subsequently completely encompasses the PCB 19, including the temperature probe 9 which is located in the drawing plane underneath the sectioned, drawn PCB 19. A chemical influencing of the PCB 19 and in particular the temperature probe 9 is thus prevented. The configuration of the heat conductor 37 shown in FIG. 6C can in particular be configured to be monolithic and encompass a second temperature probe 9.

In an embodiment, the heat conductor 37 can have a breakdown voltage of >500 Volts. The breakdown voltage is even higher in an embodiment, for example >600 V, >700 V, >800 V, >900 V and particularly preferably >1000 V.

What is claimed is:

1. An assembly for detecting a temperature of an electrically conductive element, comprising:
   a temperature probe; and
   a heat conductor separate from the temperature probe and made of an electrically insulating and heat-conductive material, the heat conductor surrounds the temperature probe at least in sections and has a bearing surface formed of the electrically insulating and heat-conductive material and bearing against the electrically conductive element.

2. The assembly of claim 1, wherein the bearing surface is elastically deformable.

3. The assembly of claim 1, wherein the bearing surface is at least partially concave.

4. The assembly of claim 1, wherein the heat conductor is formed of a silicone.

5. The assembly of claim 1, wherein the temperature probe is arranged on a circuit board.

6. The assembly of claim 1, wherein the heat conductor surrounds at least three sides of the temperature probe.

7. The assembly of claim 5, wherein a section of the circuit board is plugged into the heat conductor.

8. The assembly of claim 1, wherein the heat conductor has a slot adapted to receive the temperature probe.

9. The assembly of claim 1, wherein the heat conductor completely encloses the temperature probe.

10. The assembly of claim 1, wherein the heat conductor includes an electrically insulating outer shell and a heat-conductive medium received in the outer shell.

11. The assembly of claim 1, wherein the heat conductor has a breakdown voltage greater than 500 Volts.

12. A contact assembly, comprising:
    a contact receptacle receiving an electrically conductive element; and
    a sensor receptacle receiving an assembly for detecting a temperature of the electrically conductive element including a temperature probe and a heat conductor separate from the temperature probe, the heat conductor is made of an electrically insulating and heat-conductive material and surrounds the temperature probe at least in sections and has a bearing surface formed of the electrically insulating and heat-conductive material and bearing against the electrically conductive element.

13. The contact assembly of claim 12, wherein the contact assembly is a socket or a plug.

14. The contact assembly of claim 12, wherein the sensor receptacle is formed in a secondary latching element.

15. The contact assembly of claim 14, wherein the assembly is moved with the secondary latching element.

16. The contact assembly of claim 15, wherein, in a position of the secondary latching element, the heat conductor abuts against the contact receptacle or overlaps with the contact receptacle.

17. The contact assembly of claim 12, wherein the sensor receptacle is potted with a material of the heat conductor.

18. An assembly for detecting a temperature of an electrically conductive element, comprising:
    a temperature probe; and
    a heat conductor separate from the temperature probe and made of an electrically insulating and heat-conductive material, the heat conductor surrounds the temperature probe at least in sections and has a bearing surface bearing against the electrically conductive element, the heat conductor surrounds at least three sides of the temperature probe.

19. The assembly of claim 18, wherein the heat conductor completely encloses the temperature probe.

20. An assembly for detecting a temperature of an electrically conductive element, comprising:
    a temperature probe arranged on a circuit board; and
    a heat conductor separate from the temperature probe and made of an electrically insulating and heat-conductive material, the heat conductor surrounds the temperature probe at least in sections and has a bearing surface bearing against the electrically conductive element, a section of the circuit board is plugged into the heat conductor.

21. An assembly for detecting a temperature of an electrically conductive element, comprising:
    a temperature probe; and
    a heat conductor separate from the temperature probe and made of an electrically insulating and heat-conductive material, the heat conductor surrounds the temperature probe at least in sections and has a bearing surface bearing against the electrically conductive element, the heat conductor has a slot adapted to receive the temperature probe.

22. An assembly for detecting a temperature of an electrically conductive element, comprising:
    a temperature probe; and
    a heat conductor separate from the temperature probe and made of an electrically insulating and heat-conductive material, the heat conductor surrounds the temperature probe at least in sections and has a bearing surface bearing against the electrically conductive element, the heat conductor includes an electrically insulating outer shell and a heat-conductive medium received in the outer shell.

* * * * *